United States Patent
Choi et al.

(10) Patent No.: US 12,224,189 B2
(45) Date of Patent: Feb. 11, 2025

(54) SUBSTRATE TYPE SENSOR AND METHOD OF MEASURING THE IMPACT POINT AND THE IMPACT FORCE OF CHEMICAL

(71) Applicant: SEMES CO., LTD., Cheonan-si (KR)

(72) Inventors: Young Seop Choi, Cheonan-si (KR); Yong-Jun Seo, Hwaseong-si (KR); Sang Hyun Son, Busan (KR); Jun Gwon Lee, Ulsan (KR); Hak Hyon Kim, Cheonan-si (KR); Sun Yong Park, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 374 days.

(21) Appl. No.: 17/564,562

(22) Filed: Dec. 29, 2021

(65) Prior Publication Data

US 2022/0205081 A1 Jun. 30, 2022

(30) Foreign Application Priority Data

Dec. 31, 2020 (KR) .......................... 10-2020-0189428

(51) Int. Cl.
| | | |
|---|---|---|
| *H01L 21/67* | (2006.01) | |
| *C23C 16/02* | (2006.01) | |
| *C23C 16/455* | (2006.01) | |
| *C23C 16/52* | (2006.01) | |
| *G01L 5/00* | (2006.01) | |

(Continued)

(52) U.S. Cl.
CPC .... *H01L 21/67253* (2013.01); *C23C 16/0227* (2013.01); *C23C 16/45563* (2013.01); *C23C 16/52* (2013.01); *G01L 5/0052* (2013.01); *G01L 19/083* (2013.01); *G01L 19/086* (2013.01); *G01L 19/147* (2013.01); *H01L 21/67259* (2013.01)

(58) Field of Classification Search
CPC ... G01L 5/0052; G01L 19/083; G01L 19/086; G01L 19/147; H01L 21/67253; H01L 21/67259; H01L 21/67051; H01L 21/6708; H01L 21/6715; H01L 21/68764; H01L 22/34; C23C 16/0227; C23C 16/45563; C23C 16/52; G01D 11/30
See application file for complete search history.

(56) References Cited

U.S. PATENT DOCUMENTS

| | | | |
|---|---|---|---|
| 2006/0021439 A1* | 2/2006 | Kerr ................. | H01L 21/67057 73/649 |
| 2006/0234398 A1 | 10/2006 | Gluschenkov | |
| 2020/0370982 A1* | 11/2020 | Won ....................... | G01L 1/205 |

FOREIGN PATENT DOCUMENTS

| | | |
|---|---|---|
| CN | 112151416 | 12/2020 |
| JP | 06-281516 | 10/1994 |
| KR | 10-2013-0110521 | 10/2013 |

(Continued)

OTHER PUBLICATIONS

Office Action from the Korean Intellectual Property Office dated Oct. 4, 2022.

*Primary Examiner* — Benjamin R Schmitt (57) ABSTRACT

A substrate type sensor includes a substrate shape member, a pressure sensor panel provided at the substrate shape member, the pressure sensor panel including a plurality of pressure sensors, a central module including a transmission unit, the reception unit receiving data from the pressure sensor panel, and a battery proving power to the pressure sensor panel and the central module.

9 Claims, 6 Drawing Sheets

(51) Int. Cl.
*G01L 19/08* (2006.01)
*G01L 19/14* (2006.01)

(56) References Cited

FOREIGN PATENT DOCUMENTS

| | | | |
|---|---|---|---|
| KR | 101420159 | 7/2014 | |
| KR | 10-2016-0083288 | 7/2016 | |
| KR | 101993732 | 11/2018 | |
| KR | 10-2020-0134582 | 12/2020 | |
| TW | 200701385 | 1/2007 | |
| TW | 201711089 | 3/2017 | |
| WO | WO-2005088683 A2 * | 9/2005 | ....... H01L 21/67253 |
| WO | 2015159973 | 10/2015 | |
| WO | 2016032241 | 3/2016 | |
| WO | 2020117201 | 6/2020 | |

\* cited by examiner

SUBSTRATE TYPE SENSOR AND METHOD OF MEASURING THE IMPACT POINT AND THE IMPACT FORCE OF CHEMICAL

CROSS-REFERENCE TO RELATED APPLICATIONS

A claim for priority under 35 U.S.C. § 119 is made to Korean Patent Application No. 10-2020-0189428 filed on Dec. 31, 2020, in the Korean Intellectual Property Office, the entire contents of which are hereby incorporated by reference.

BACKGROUND

Embodiments of the inventive concept described herein relate to a substrate type sensor and a method of measuring an impact point and an impact force of a chemical.

In order to manufacture a semiconductor device or a flat plate display panel, various processes such as a photolithography process, an ashing process, an etching process, an ion implantation process, a thin film deposition process, and a cleaning process are performed on a substrate. Among them, the cleaning process is a process for removing particles remaining on the substrate, and is performed in the steps before and after each process.

The cleaning process is applied differently depending on a surface property of the substrate. In particular, when the surface of the substrate is hydrophobized or a hydrophobized surface is cleaned, a chemical treatment step and a wetting treatment step are performed. A chemical is supplied to the substrate while rotating, and then a wetting liquid is supplied. In addition, before and after a process of treating the substrate by supplying a liquid such as a chemical wetting liquid, a gas such as inert gas may be supplied to the substrate for drying, etc.

In such a process of supplying a fluid such as a liquid and a gas, a location on the substrate to which the fluid is supplied affects the process. Accordingly, it is required to accurately set the nozzle so that the fluid is supplied to a correct position on the substrate.

In addition, it is not easy to determine whether a point at which the fluid is supplied on the substrate is deviating from the correct position, and it is not easy to determine whether there is an abnormality in a supply amount or a supply pressure of the supplied gas and liquid.

SUMMARY

Embodiments of the inventive concept provide a substrate type sensor and a method for measuring an impact point and an impact force of a chemical for easily determining whether a substrate is at a correct position.

Embodiments of the inventive concept provide a substrate type sensor and a method for measuring an impact point and an impact force of a chemical for easily determining whether a supply point of a fluid supplied to a top surface and a bottom surface of a substrate is at a correct position.

Embodiments of the inventive concept provide a substrate type sensor and a method for measuring an impact point and an impact force of a chemical for easily setting a location of a nozzle discharging a fluid.

Embodiments of the inventive concept provide a substrate type sensor and a method for measuring an impact point and an impact force of a chemical for easily determining whether a supply state of a fluid is abnormal.

The technical objectives of the inventive concept are not limited to the above-mentioned ones, and the other unmentioned technical objects will become apparent to those skilled in the art from the following description.

According to an embodiment of the present invention, a substrate type sensor comprises: a substrate shape member; a pressure sensor panel provided at the substrate shape member, the pressure sensor panel including a plurality of pressure sensors; a central module including a reception unit, the reception unit receiving data collected from the pressure sensor panel; and a battery providing power to the pressure sensor panel and the central module.

In an embodiment, the substrate shape member has a substantially same physical size as a substrate.

In an embodiment, the substrate type sensor further comprises a transmission unit for transmitting the data received from the reception unit to the outside.

In an embodiment, the transmission unit comprises a wireless communication module.

In an embodiment, the pressure sensor panel comprises: a front pressure sensor panel provided at a front of the substrate shape member; and a back pressure sensor panel provided at a back of the substrate shape member.

In an embodiment, the central module and the battery are provided at a front of the substrate shape member.

In an embodiment, the substrate type sensor is provided at an apparatus for treating a substrate with a chemical liquid, and the pressure sensor panel is installed near a location at which the liquid chemical is discharged or at an entirety of the substrate shape member.

In an embodiment, the plurality of pressure sensors are aligned in columns and rows.

In an embodiment, the substrate type sensor is provided at a liquid treating apparatus for treating a substrate with a liquid chemical, and the pressure sensor panel measures one or more of an impact point and an impact force of the liquid chemical.

According to an embodiment of the present invention, a liquid treating apparatus for treating a substrate with a chemical liquid comprises: a support unit for supporting the substrate; a nozzle for discharging a first liquid chemical to a top surface of the substrate disposed on the support unit; a back nozzle for discharging a second liquid chemical to a bottom surface of the substrate disposed on the support unit, and a pressure sensor panel including a front pressure sensor panel provided at a front of the substrate, and a back pressure sensor panel provided at a back of the substrate. The front pressure sensor panel measures one or more of an impact point and an impact force of the first liquid chemical of the nozzle, and the back pressure sensor panel measures one or more of an impact point and an impact force of the second liquid chemical of the back nozzle.

The inventive concept provides a method for measuring an impact point and an impact force of a chemical discharged from a nozzle of a liquid treating apparatus for liquid treating a substrate. In an embodiment, the method comprises: positioning the substrate type sensor of claim 1 at the liquid treating apparatus; and discharging a chemical on the substrate type sensor.

In an embodiment, the liquid treating apparatus comprises: a support unit supporting the substrate; and a nozzle for discharging a first chemical onto a top surface of the substrate disposed on the support unit, the method comprises monitoring a sensing value of the pressure sensor in real time while discharging the first chemical to the substrate type sensor.

In an embodiment, the liquid treating apparatus comprises a back nozzle disposed at the support unit and discharging a second chemical onto a bottom surface of the substrate, and the pressure sensor panel comprises: a front pressure sensor panel disposed at a front of the substrate shape member for measuring one or more of an impact point or an impact force of the first chemical of the nozzle; and a back pressure sensor panel disposed at a back of the substrate shape member for measuring one or more of an impact point or an impact force of the second chemical of the back nozzle, and the method comprises monitoring sensing value of the pressure sensor in real time while discharging one or more of the first chemical or the second chemical to the substrate type sensor.

In an embodiment, the pressure sensor panel is installed near a location the first chemical is discharged or at an entirety of the substrate shape member.

In an embodiment, the support unit rotatably supports the substrate, and the first chemical is discharged onto the substrate type sensor when the substrate type sensor is stationary supported by the support unit.

In an embodiment, the support unit rotatably supports the substrate, and the second chemical is discharged onto the substrate type sensor when the substrate type sensor is stationary supported by the support unit.

In an embodiment, the method further comprises displaying a sensing value of the pressure sensor at a display, and wherein the display shows location(s) of the pressure sensor (s) onto which the chemical has been discharged by using coordinates.

In an embodiment, the method further comprises displaying a sensing value of the pressure sensor at a display, and wherein the display shows the pressure sensor(s) onto which the chemical has been discharged by using brightness of color depending on impact force of the chemical discharged onto the pressure sensor(s).

In an embodiment, further comprises displaying a sensing value of the pressure sensor at the display, and wherein the display shows location(s) of the pressure sensor(s) onto which the chemical has been discharged by using coordinates and brightness of color depending on impact force of the chemical discharged onto the pressure sensor(s).

According to an embodiment of the present invention, a substrate type sensor comprises: a substrate shape member having a substantially same physical size as a substrate; a front pressure sensor panel provided at a front of the substrate shape member, the front pressure sensor panel including a plurality of pressure sensors; a back pressure sensor panel provided at a back of the substrate shape member, the back pressure sensor panel including a plurality of pressure sensors; a central module provided at the front of the substrate shape member, and including a reception unit receiving data from the front and back pressure sensor panels and a transmission unit transmitting the data received from the reception unit to the outside; and a battery provided at the front of the substrate shape member and providing a power to the front and back pressure sensor panels and the central module.

In an embodiment, the support unit provides the substrate to be rotatable, and the first chemical according to the substrate type sensor is discharged at a stopped state of the substrate type sensor.

In an embodiment, the support unit provides the substrate to be rotatable, and the second chemical according to the substrate type sensor is discharged at a stopped state of the substrate type sensor.

In an embodiment, the method further comprises receiving and showing a sensed value of the pressure sensor at a display, and wherein an impacted location of the pressure sensor among the pressure sensor of the display is shown with coordinates.

In an embodiment, the method further comprises showing a sensed value of the pressure sensor at a display, and wherein the display shows an impact force measured from the impacted pressure sensor among the pressure sensor in a name of a color.

In an embodiment, the method further comprises showing a sensed value of the pressure sensor at the display, and wherein the display shows a location of the impacted pressure sensor among the pressure sensor, and an impact force measured from the impacted pressure sensor among the pressure sensors in a name of a color.

The inventive concept provides a substrate type sensor. In an embodiment, the substrate type sensor comprises a member having a substrate shape and a substantially same physical size as a size of the substrate; a front pressure sensor panel provided at a front of the member and provided as a plurality of pressure sensors; a back pressure sensor panel provided at a back of the member and provided as a plurality of pressure sensors; a central module provided at the front of the member, and having a reception unit receiving a collected data from the pressure sensor panel and a transmission unit transmitting the data received from the reception unit to the outside and provided as a wireless communication module; and a battery provided at the front of the member and providing a power to the pressure sensor panel and the central module.

According to an embodiment of the inventive concept, whether a supply point of a fluid on a substrate is a correct position may be determined.

According to an embodiment of the inventive concept, whether a supply point of a fluid supplied to a top surface and a bottom surface of a substrate is a correct position may be determined.

According to an embodiment of the inventive concept, a location of a nozzle discharging a fluid may be easily set.

According to an embodiment of the inventive concept, whether a supply state of a fluid is abnormal may be determined.

The effects of the inventive concept are not limited to the above-described effects. Effects not mentioned will be clearly understood by those skilled in the art to which this invention pertains from this specification and the accompanying drawings.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, embodiments of the inventive concept will be described in detail with reference to the accompanying drawings so that those skilled in the art may easily implement the inventive concept. However, the inventive concept may be implemented in various different forms and is not limited to the embodiments described herein. In addition, when it is determined that a detailed description of a related known function or configuration may unnecessarily obscure the subject matter of the inventive concept, the detailed description thereof will be omitted. In addition, the same reference numerals are used throughout the drawings for parts that perform similar functions and functions.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

In the specification, the singular forms include plural forms unless particularly mentioned. Also, the shapes or sizes of elements in a figure may be exaggerated for a clearer illustration.

When a component is referred to as "connected" or "connecting" to another component, it should be understood that there may be other components directly connected or connected to the other component, but there may be other components in the middle. On the other hand, when a component is referred to as "directly connected" or "directly connecting" to another component, it should be understood that no other component exists in the middle. Other expressions explaining the relationship between components, such as "between" and "right between" or "neighbor to" and "directly adjacent to", should also be interpreted.

Although not defined, all the terms (including technical or scientific terms) used herein may have the same meanings that are generally accepted by the common technologies in the field to which the inventive concept pertains. The terms defined by the general dictionaries may be construed to have the same meanings as those meant in the related technologies and the disclosure of the application, and will neither become conceptual nor be construed to be excessively formal even though not clearly defined herein. The terms used herein are provided to describe the embodiments but not to limit the inventive concept. In the specification, the singular forms include plural forms unless particularly mentioned. The expressions 'include' and its various conjugated forms, such as 'including', which are used in the specification do not exclude existence or addition of one or more compositions, substances, elements, steps, operations, and devices.

In the embodiment, application to an apparatus provided in a process of cleaning and processing a substrate will be described as an example. However, the inventive concept is not limited thereto, and may be applied to various types of devices that process substrates by supplying fluids such as liquids and gases.

Figure 1:
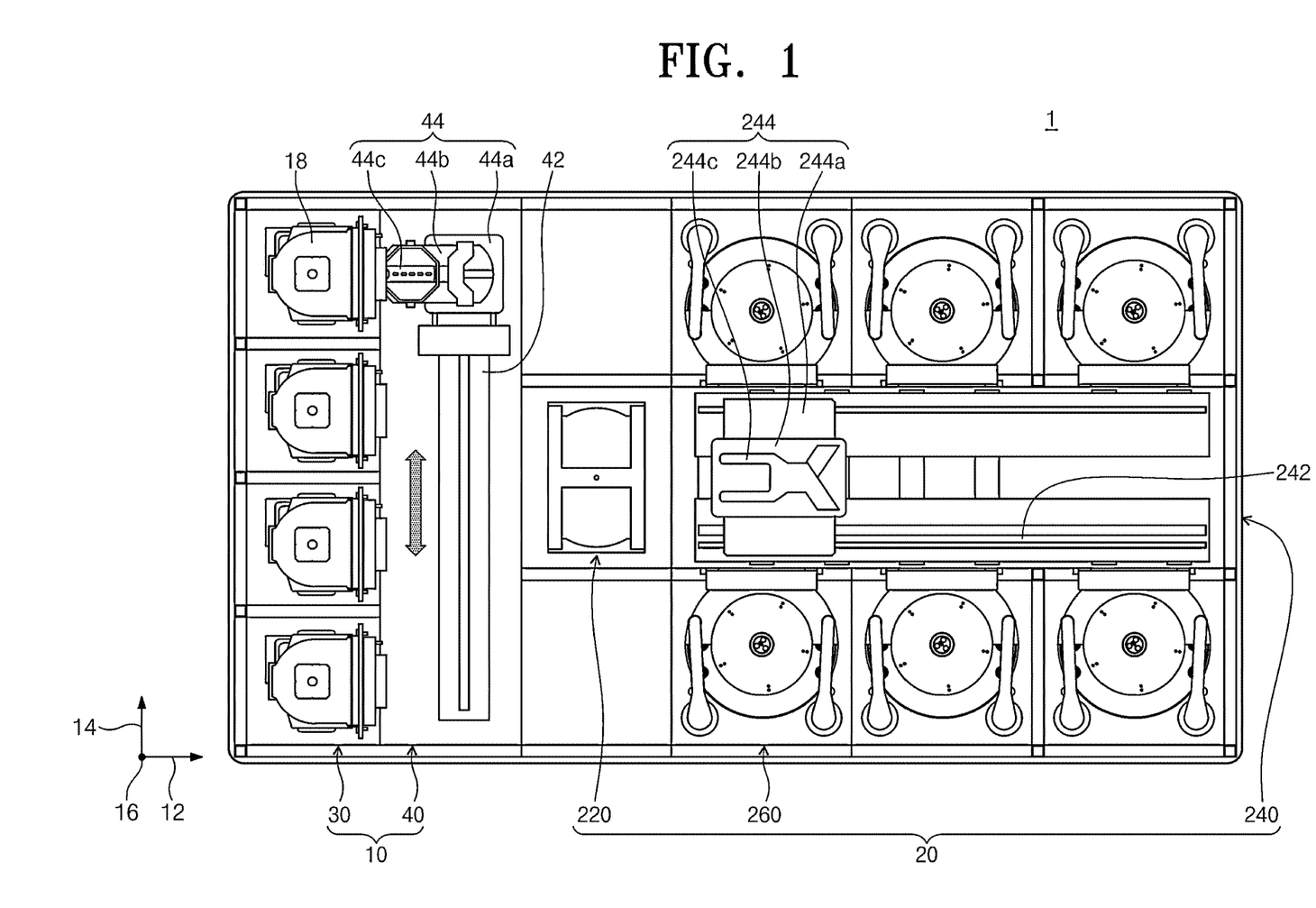
FIG. 1 is a top plan view illustrating a substrate treating facility according to an embodiment of the inventive concept.

FIG. 1 is a plan view of a substrate treating facility according to an embodiment of the inventive concept. Referring to FIG. 1, the substrate treatment facility 1 comprises an index module 10 and a processing module 20. The index module 10 has a load port 30 and a transfer frame 40. The load port 30, the transfer frame 40, and the processing module 20 are sequentially arranged in a direction. Hereinafter, a direction in which the load port 30, the transfer frame 40, and the processing module 20 are arranged will be referred to as a first direction 12, a direction that is perpendicular to the first direction 12 when viewed from above will be referred to as a second direction 14, and a direction that is perpendicular to both the first direction 12 and the second direction 14 will be referred to as a third direction 16.

At the load port 30, a carrier 18 storing a substrate W is mounted. The load port 30 is provided in a plurality and they are arranged in a row in the second direction 14. A number of the plurality of load ports 30 may increase or decrease depending on a process efficiency or a footprint condition, etc. of the processing module 20. At the carrier 18 a plurality of slots (not shown) are formed for storing the substrates horizontally to the ground. For the carrier 18, a closing-type container such as the Front Open Unified Pod (FOUP) can be used.

The processing module 20 includes a buffer unit 220, a transfer chamber 240, and a process chamber 260. The transfer chamber 240 may be provided such that its lengthwise direction is parallel to the first direction 12. The process chambers 260 are placed at each side of the transfer chamber 240. At both sides of the transfer chamber 240, the process chambers 260 are provided symmetrically based on the transfer chamber 240. A plurality of process chambers 260 are provided at a side of the transfer chamber 240. A part of the process chambers 260 are provided along a direction of a length of the transfer chamber 240. Also, a part of the process chambers 260 are provided stacked one above another. In other words, the process chambers 260 may be provided in an array of A×B at a side of the transfer chamber 240. Here A is a number of process chambers 260 arranged in the first direction 12, B is a number of process chambers 260 arranged in the third direction 16. When four or six process chambers 260 are provided at a side of the transfer chamber 240, the process chambers 260 may be arranged in an array of 2×2 or 3×2. A number of process chambers may increase or decrease.

Selectively, the process chamber 260 may be provided at only a side of the transfer chamber 240. Also, the process chamber 260 may be provided at a side or both sides in one layer.

The buffer unit 200 can be placed between the transfer frame 40 and the transfer chamber 240. The buffer unit 220 provides a space for the substrate W to temporarily stay before the substrate W is transferred between the transfer chamber 240 and the transfer frame 40. At an inside of the buffer unit 220, a slot (not shown) is provided for placing the substrate W thereon. The slots (not shown) may be provided in a plurality and spaced apart in the third direction 16. A side of the buffer unit 220 facing the transfer frame 40 and a side of the buffer unit 220 facing the transfer chamber 240 is provided open.

The transfer frame 40 transfers the substrate W between the carrier 18 mounted at the load port 30 and the buffer unit 220. The transfer frame 40 is provided with an index rail 42 and an index robot 44. The index rail 42 is provided such that its lengthwise direction is parallel to the second direction 14. The index robot 44 is installed at the index rail 42 and is linearly moved in the second direction 14 along the index rail 42. The index robot 44 has a base 44a, a body 44b, and an index arm 44c. The base 44a is installed to be movable along the index rail 42. The body 44b is coupled to the base 44a. The body 44b is provided to be movable along the third direction 16 on the base 44a. In addition, the body 44b is provided to be rotatable on the base 44a. The index arm 44c is coupled to the body 44b and is provided to be forwardly and backwardly movable with respect to the body 44b. A plurality of index arms 44c are provided to be individually driven. The index arms 44c are disposed to be stacked one above another while being spaced apart from each other in the third direction 16. Some of the index arms 44c may be used to transfer the substrate W from the processing module 20 to the carrier 18, and the other index arms 44c may be used to transfer the substrate W from the carrier 18 to the processing module 20. This may prevent particles generated from the substrate W before processing from being attached to the substrate W after processing in a process of bringing in and taking out the substrate W by the index robot 44.

The transfer chamber 240 transfers the substrate W between the buffer unit 220 and the process chamber 260 and between the process chambers 260. The transfer chamber 240 is provided with a guide rail 242 and a main robot 244. The guide rail 242 is provided such that its lengthwise direction is parallel to the first direction 12. The main robot 244 is installed on the guide rail 242 and is linearly moved along the first direction 12 on the guide rail 242. The main robot 244 has a base 244a, a body 244b, and a main arm 244c. The base 244a is installed to be movable along the guide rail 242. The body 244b is coupled to the base 244a. The body 244b is provided to be movable along the third direction 16 on the base 244a. In addition, the body 244b is provided to be rotatable on the base 244a. The main arm 244c is coupled to the body 244b, which is provided to be forwardly and backwardly movable with respect to the body 244b. A plurality of main arms 244c are provided to be individually driven. The main arms 244c are disposed to be stacked while being spaced apart from each other in the third direction 16.

A substrate treating apparatus 300 (see FIG. 2 and FIG. 3) for performing a cleaning process on the substrate W is provided in the process chamber 260. The substrate treating apparatus 300 provided in each process chamber may have different structures depending on the type of cleaning process to be performed. Unlike this, the substrate treating apparatus 300 in each process chamber 260 may have the same structure. Selectively, the process chambers 260 are divided into a plurality of groups, and the substrate treating apparatuses 300 provided within the process chambers 260 belonging to the same group may have the same structure, and the substrate treating apparatuses 300 provided within the process chambers 260 belonging to a different group may have different structures.

Figure 2:
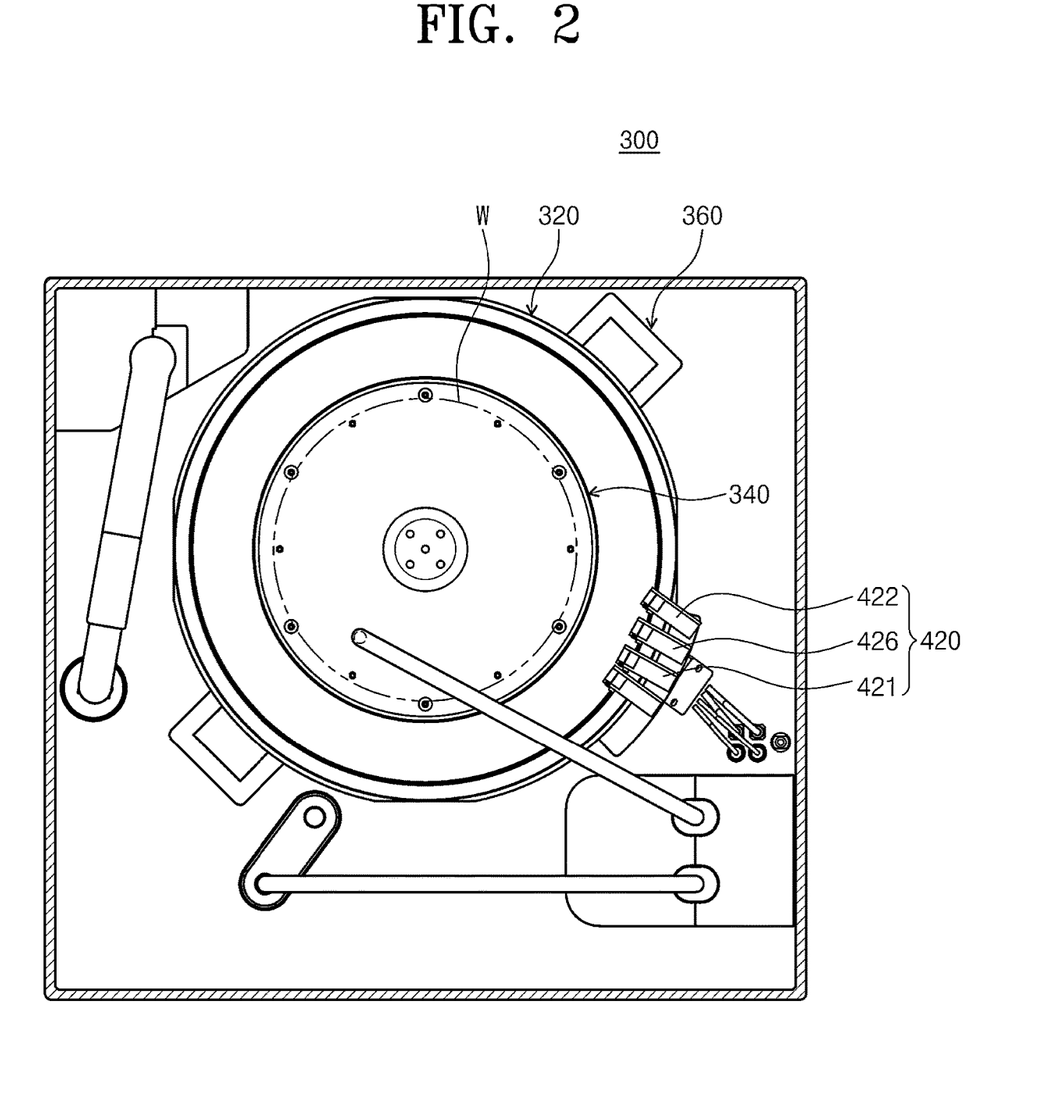
FIG. 2 is a top plan view illustrating a substrate treating apparatus of FIG. 1.
Figure 3:
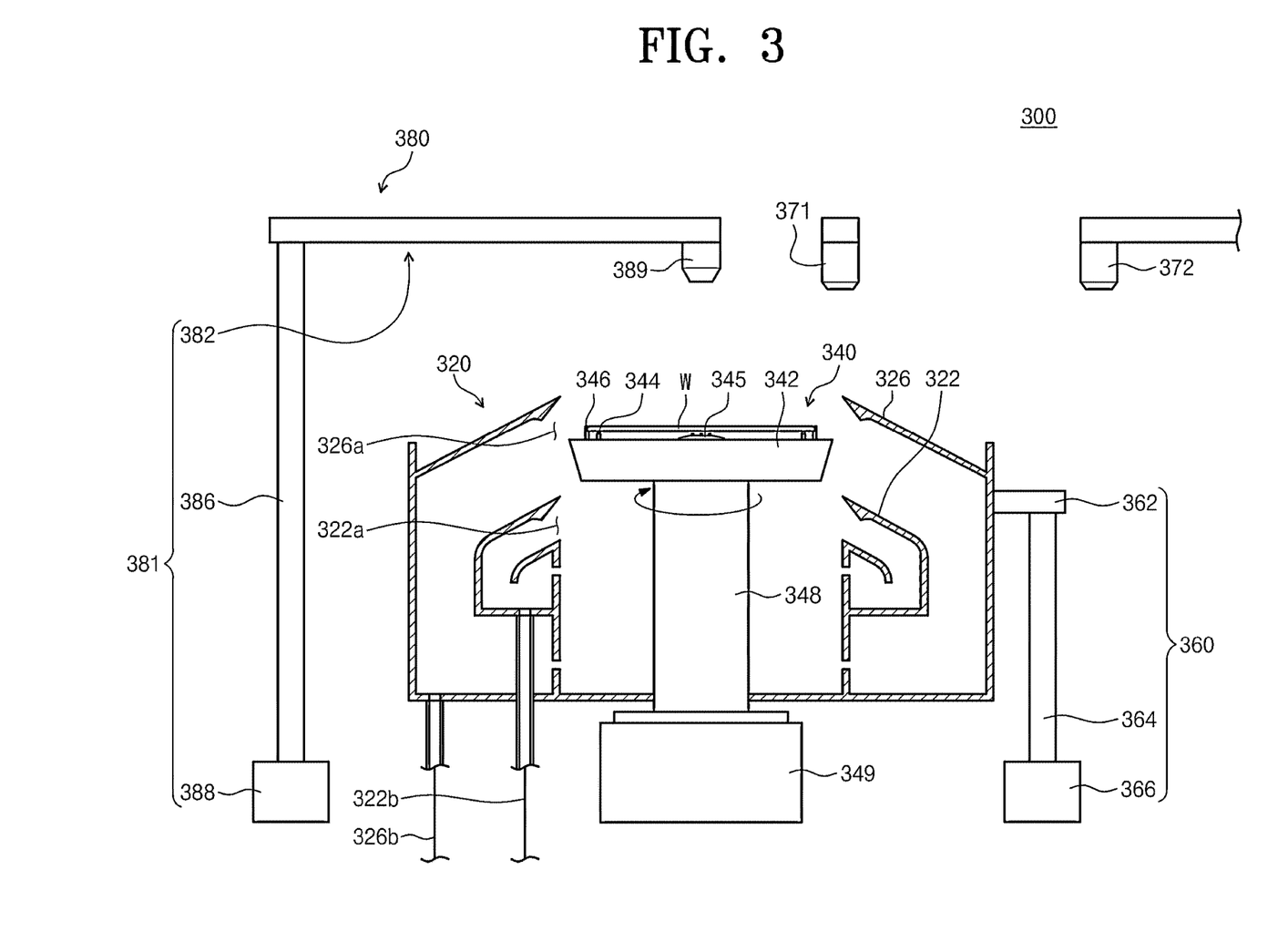
FIG. 3 is a cross sectional view illustrating the substrate treating apparatus of FIG. 1.

The substrate treating apparatus 300 performs a process of cleaning the substrate. FIG. 2 is a cross-sectional view illustrating the substrate treating apparatus of FIG. 1. FIG. 3 is a cross-sectional view illustrating the substrate treating apparatus of FIG. 1. Referring to FIG. 2 and FIG. 3, the substrate treating apparatus 300 includes a processing container 320, a support unit 340, a lifting/lowering unit 360, and fluid supply units 380 and 420.

The processing container 320 is provided in a container of any shape with a top thereof being open. The processing container 320 has an inner recollecting container 322 and an outer recollecting container 326. Each of the recollecting containers 322 and 326 recollect different treating liquids among the treating liquids used in the process. The inner recollecting container 322 is provided in an annular ring shape surrounding the support unit 340, and the outer recollecting container 326 is provided in an annular ring shape surrounding the inner recollecting container 322. An inner space 322a of the inner recollecting container 322 functions as a first inlet through which a treating liquid flows into the inner recollecting container 322. The space 326a between the inner recollecting container 322 and the outer recollecting container 326 functions as a second inlet through which a treating liquid flows into the outer recollecting container 326. According to an embodiment, the inner space 322a and the space 326a may be located at different heights. The recollecting lines 322b and 326b are connected to the bottom surfaces of each of the recollecting containers 322 and 326. The treating liquids introduced into each of the recollecting containers 322 and 326 can be provided and reused to an outer treating liquid regeneration system (not illustrated) through the recollecting lines 322b and 326b.

The support unit 340 may support and rotate the substrate W during the process. The support unit 340 has a body 342 (i.e., a spin head), a support pin 344, a chuck pin 346, and a support shaft 348. The body 342 has a top surface that is generally provided in a circular shape when viewed from above. The support shaft 348 rotatable by a driving unit 349 is fixedly coupled to a bottom surface of the body 342. The support unit 340 is further provided with a back nozzle 345. The back nozzle 345 is for spraying a chemical onto the bottom surface of the substrate W. The back nozzle 345 injects a liquid such as a pure water and/or a nitrogen gas onto the bottom surface of the substrate. The back nozzle 345 is located at the center of the support unit 340.

A support pin 344 is provided in a plurality. The support pins 344 are disposed at an edge of a top surface of the body 342, spaced apart from each other by a predetermined distance and upwardly protrude from the body 342. The support pins 344 are disposed to have an annular ring shape as a whole in combination with each other. The support pins 344 support the bottom surface edge of the substrate W so that the substrate W is spaced apart from the top surface of the body 342 by a predetermined distance.

A chuck pin 346 is provided in a plurality. The chuck pins 346 are disposed farther from a center of the body 342 than the support pin 344. The chuck pins 346 are provided to upwardly protrude from the body 342. The chuck pins 346 support a side of the substrate W so that the substrate W is not laterally deviated from a correct position when the body 342 is rotated. The chuck pins 346 are provided to linearly move between a standby position and a support position along a radial direction of the body 342. The standby position is a position far away from the center of the body 342 compared to the support position. When the substrate W loads or unloads on the body 342, the chuck pins 346 are located at the standby position, and when the process is performed on the substrate W, the chuck pins 346 are located at the support position. At the support position, the chuck pins 346 are in contact with the side of the substrate W.

The lifting/lowering unit 360 linearly moves the processing container 320 in an up/down direction. As the processing container 320 is moved up and down, a relative height of the processing container 320 with respect to the body 342 is changed. The lifting/lowering unit 360 has a bracket 362, a moving shaft 364, and a driver 366. The bracket 362 is fixedly installed on an outer wall of the processing container 320, and a moving shaft 364 moving in the up/down direction by the driver 366 is fixedly coupled to the bracket 362. When the substrate W is placed on the body 342 or lifted from the body 342, the processing container 320 is lowered so that the body 342 upwardly protrudes from the processing container 320. In addition, when the process is performed, a height of the processing container 320 is adjusted so that the treating liquid may flow into each of the predetermined recollecting containers 322 and 326 according to the type of treating liquid supplied to the substrate W. Selectively, the lifting/lowering unit 360 may move the processing container 320 in the up/down direction.

The fluid supply units 380 and 420 supply various types of fluids onto the substrate W. According to an embodiment, the fluid supply units 380 and 420 may supply a chemical, a rinsing liquid, an organic solvent, and a drying gas. The fluid supply units 380 and 420 include a moving nozzle unit 380 and a fixed nozzle unit 420.

The moving nozzle unit 380 includes a first moving nozzle 389, a second moving nozzle 371, a replacement nozzle 372, and a plurality of nozzle moving members 381. The first moving nozzle 389 discharges a first treating liquid, the second moving nozzle 371 discharges a second treating liquid, and the replacement nozzle 372 discharges the organic solvent. The first moving nozzle 389, the second moving nozzle 371, and the replacement nozzle 372 supply the liquid to the process position of the substrate W supported by the support unit 340. Here, the process position may be a position including the center of the substrate W. Each of the first moving nozzle 389, the second moving nozzle 371, and the replacement nozzle 372 may be moved to a process position and a standby position by the nozzle moving member 381. Here, the process position is a position at which each nozzle faces the substrate W supported by the support unit 340, and the standby position is a position at which the respective nozzles 389, 371, and 372 are out of the process position. According to an embodiment, the process position may be a position at which the nozzles 389, 371, and 372 may supply the liquid to the center of the substrate W. The first treating liquid and the second treating liquid may be a chemical with different properties. The first treating liquid may be a chemical including a diluted hydrofluoric acid (HF), and the second treating liquid may be a chemical including an ammonia (NH3). The organic solvent may be a liquid containing isopropyl alcohol (IPA).

The nozzle moving member 381 includes a support shaft 386, a support arm 382, and a driving member 388. The support shaft 386 is located on a side of the processing container 320. The support shaft 386 has a rod shape with its lengthwise direction along the third direction 16. The support shaft 386 is provided to be rotatable by the driving member 388. The support arm 382 is coupled to an upper end of the support shaft 386. The support arm 382 extends vertically from the support shaft 386. Each nozzle is fixedly coupled to an end of the support arm 382. As the support shaft 386 is rotated, each nozzle 389, 371, and 372 may swing together with the support arm 382. Each of the nozzles 389, 371, and 372 may swing and move to a process position and a standby position. When viewed from above, the respective nozzles 389, 371, and 372 may be located such that discharge ports coincide with the center of the substrate W at the process position.

Selectively, the support shaft 386 may be provided to be movable in the up/down direction. In addition, the support arm 382 may be provided to be able to be forwardly and backwardly movable in its lengthwise direction.

The fixed nozzle unit 420 includes one or more fixed nozzles for discharging a fluid such as a drying gas and/or a wetting liquid on the substrate W placed on the support unit 340. For example, the fixed nozzle unit 420 includes a first nozzle 421, a second nozzle 422, and a third nozzle 423. The first nozzle 421, the second nozzle 422, and the third nozzle 423 may be provided as a fixed nozzle for discharging the fluid from a position outside an area facing a top surface of the substrate W placed above the support unit 340, i.e., the first nozzle 421, the second nozzle 422, and the third nozzle 423 is located outside but above the substrate W.

The first nozzle 421 may discharge the gas on the substrate W placed on the support unit 340, the second nozzle 422 may discharge the first liquid on the substrate W placed on the support unit 340, and the third nozzle 423 may discharge the second liquid on the substrate W placed on the support unit 340. The first liquid and the second liquid may discharge the same or different liquids. For example, the first nozzle 421 discharges the drying gas, and the second nozzle 422 and the third nozzle 423 discharge the wetting liquid. For example, the wetting liquid may be a wetting liquid that maintains the surface of the substrate W in a wet state. The wetting liquid can be a pure water.

The fluid supply units 380 and 420 may be controlled by a controller (not shown). The controller (not shown) controls the moving nozzle unit 380 and the fixed nozzle unit 420 to supply each fluid according to each step of the process.

Figure 4:
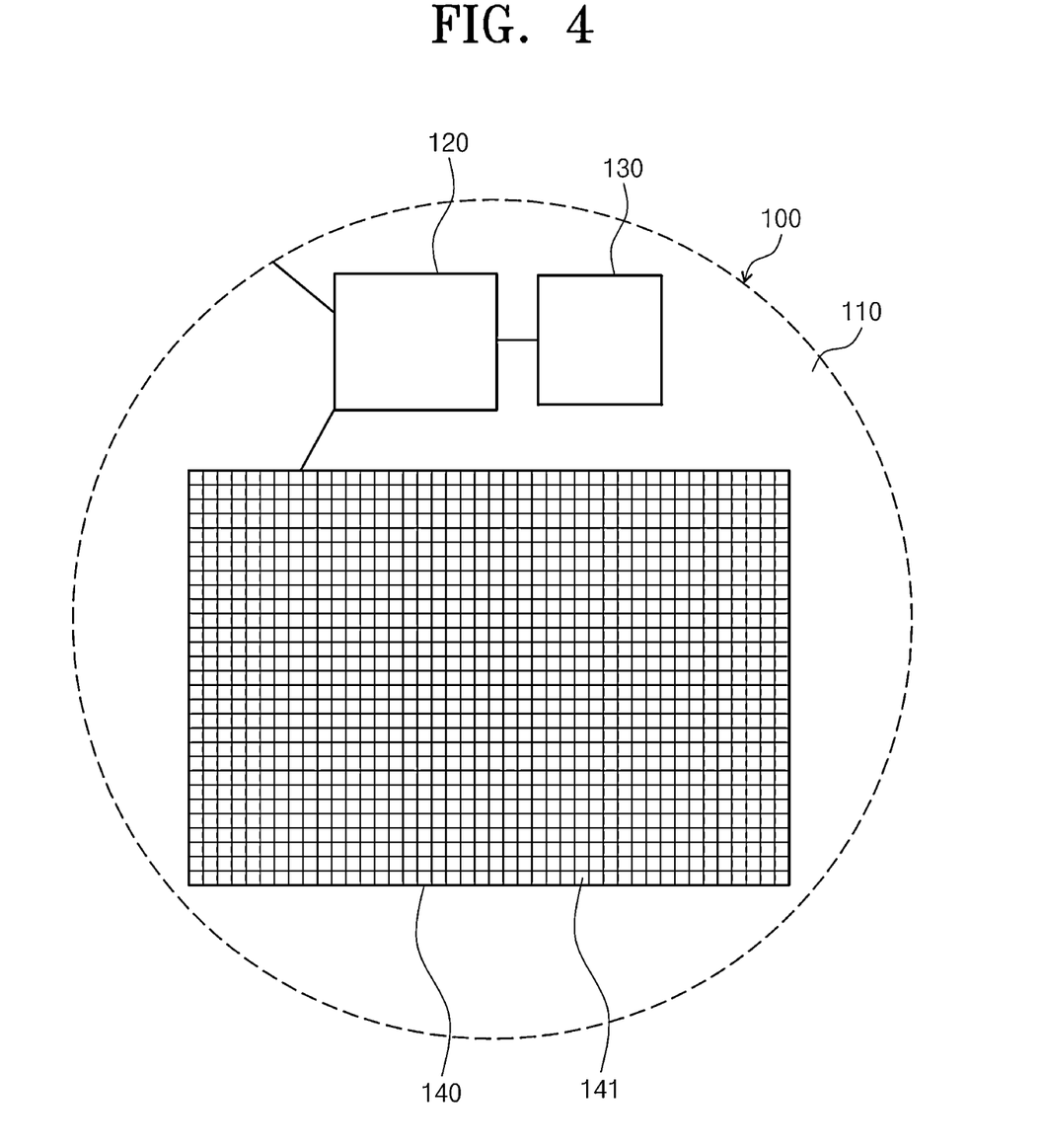
FIG. 4 is a top plan view illustrating a substrate type sensor according to an embodiment of the inventive concept.
Figure 5:
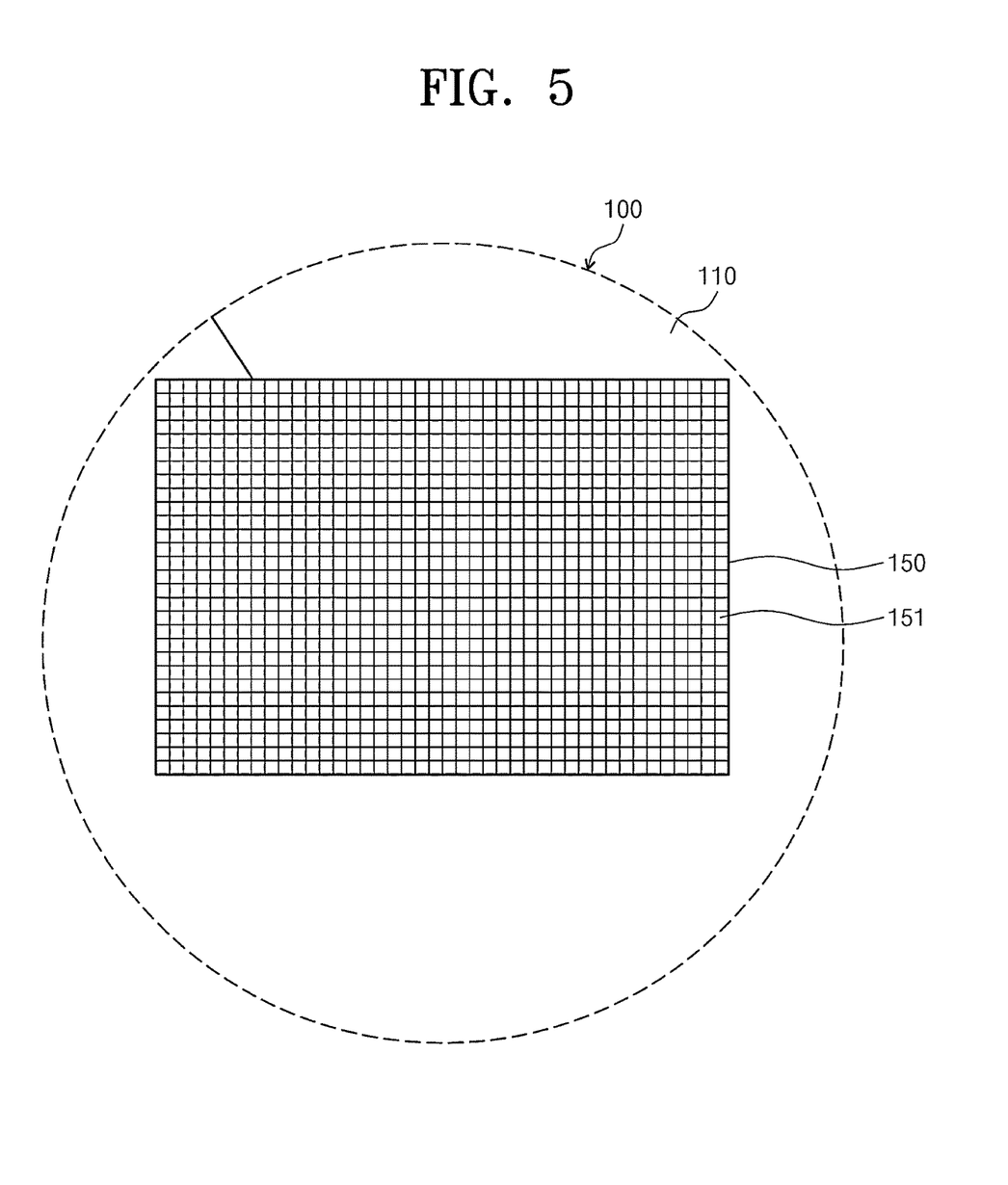
FIG. 5 is a bottom view illustrating the substrate type sensor according to an embodiment of the inventive concept.

FIG. 4 is a top plan view of a substrate-type sensor according to an embodiment of the inventive concept. FIG. 5 is a bottom view of the substrate-type sensor according to an embodiment of the inventive concept when viewed from the bottom. Referring to FIG. 4 and FIG. 5, the substrate-type sensor 100 according to an embodiment of the inventive concept includes a substrate shape member 110. The substrate shape member 110 is provided to have a substantially same or similar physical size as a substrate, e.g., wafer to be treated in various processes. For example, when the substrate is provided as a wafer, the substrate shape member 110 is provided to have a same or similar physical size as the wafer.

The substrate-type sensor 100 includes a central module 120, a battery 130, a front pressure sensor panel 140, and a back pressure sensor panel 150.

The central module 120 may include a communication unit for receiving data from the front pressure sensor panel 140 and the back pressure sensor panel 150, a storage unit for storing data, and a transmission unit for transmitting data. The central module 120 is electrically connected to the front pressure sensor panel 140, the back pressure sensor panel 150, and the battery 130. An outer device may display the data transmitted from the transmitting unit on a display screen. The display screen may display the transmitted data in the same. Selectively, the display screen may be displayed as processed values or images so that the operator may easily grasp the contents of the transmitted data. The front pressure sensor panel 140 and the central module 120 may communicate with each other via wire or wireless so that the central module 120 may receive data from the front pressure sensor panel 140. Likewise, the back pressure sensor panel 150 and the central module 120 may communicate with each other via wire or wireless so that the central module 120 may receive data from the back pressure sensor panel 150.

The battery 130 provides a power to the central module 120, the front pressure sensor panel 140, the back pressure sensor panel 150, and each component.

The front pressure sensor panel 140 includes a plurality of pressure sensors 141. A plurality of pressure sensors 141 form one modular panel to form the front pressure sensor panel 140. A plurality of pressure sensors 141 are arranged in a matrix, i.e., a plurality of columns and a plurality of rows). The back pressure sensor panel 150 includes a plurality of pressure sensors 151. A plurality of pressure sensors 151 form one modular panel to form the back pressure sensor panel 150. A plurality of pressure sensors 151 are arranged in a matrix, i.e., a plurality of columns and a plurality of rows. The front pressure sensor panel 140 and the back pressure sensor panel 150 may be installed around a location where the chemical is discharged or may be installed on the entire substrate.

The substrate-type sensor 100 may be supported at a location where the substrate W is supported by the support unit 340 and measure an impact point and an impact force of the chemical discharged from each nozzle 389, 371, 372, 421, 422, and 423 and the back nozzle 345.

When the chemical is discharged from the first moving nozzle 389, the second moving nozzle 371, the replacement nozzle 372, the first nozzle 421, the second nozzle 422, or the third nozzle 423, the discharged chemical collides with any one or more of the pressure sensors 141 provided to the front pressure sensor panel 140 of the substrate-type sensor 100. When the chemical is discharged to the pressure sensor 141, the pressure sensor hit by the chemical senses impact force of the chemical and thus it can be detected which pressure sensors are hit by the chemical, i.e., the position of the pressure sensors hit by the chemical and thus it can be detected where the chemical is discharged.

When the chemical is discharged from the back nozzle 345 to the substrate-type sensor 100, the discharged chemical collides with any one or more pressure sensors 151 provided to the back pressure sensor panel 150 of the substrate-type sensor 100. When the chemical is discharged to the pressure sensor 151, the pressure sensor hit by the chemical senses impact force of the chemical and thus it can be detected which pressure sensors are hit by the chemical, i.e., the position of the pressure sensors hit by the chemical and thus it can be detected where the chemical is discharged.

According to an embodiment of the inventive concept, it is possible to measure the impact point and an impact force of the chemical discharged to the top surface and the bottom surface of the substrate-type sensor 100.

Figure 6:
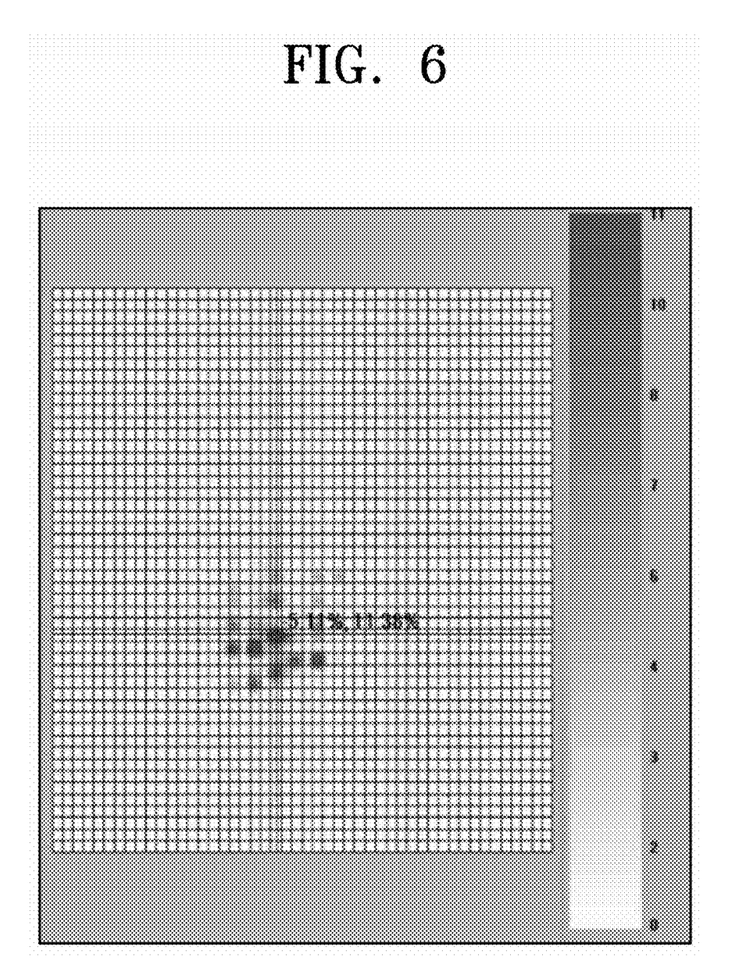
FIG. 6 is an example of a screen for monitoring an impact point and an impact force of a chemical measured according to the substrate type sensor according to an embodiment of the inventive concept.

FIG. 6 is an example of a screen for monitoring the impact point and impact force of the chemical measured according to a substrate-type sensor according to an embodiment of the inventive concept. Referring to FIG. 6, the impact point is determined based on coordinates of positions of the impacted pressure sensors 141 and 151. The pressure is displayed on coordinates for each position based on the impact force of the impacted pressure sensors 141 and 151. The display of the impact force may be displayed in a darker color as impact force is increased, and the lighter the impact force is decreased.

In the method of measuring the impact point and the impact force of the chemical according to an embodiment, when the chemical is discharged to the substrate-type sensor 100, the sensing value of the pressure sensors 141 and 151 may be transmitted to a device outside the substrate-type sensor 100 in real time, and the impact point and the impact force of the chemical may be monitored in real time.

As described above, the inventive concept provides a configuration for irradiating a light capable of easily determining a discharge direction of the fluid discharged from the nozzle, thereby easily determining whether a supply point of the fluid on a substrate is correct. Accordingly, the inventive concept may easily set the location of the nozzle discharging the fluid. In addition, when the impact point of the liquid discharged in the set state is changed according to the setting method, it is possible to easily determine whether the supply state of the fluid is abnormal, such as an abnormality in flow rate and an abnormality in discharge pressure.

The controller (not shown) may control the substrate treating apparatus. As described above, the controller (not shown) may control the components of the substrate treating apparatus 300 to treat the substrate according to a setting process. In addition, the controller (not illustrated) processes a process controller (computer) that controls the substrate treating device, a user interface made of a keyboard that manipulates a command input to manage the substrate treating apparatus and a display showing an operating situation of the substrate treating apparatus, a control program for executing processes of the substrate treating apparatus, or programs to execute various data and processing conditions. In addition, the user interface and the storage unit may be connected to the process controller. The processing recipe may be stored in a storage medium of a storage unit, the storage medium may be a hard disk, a portable disk such as a CD-ROM, a DVD, or a semiconductor memory such as a flash memory.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate type sensor comprising:
    a substrate shape member;
    a pressure sensor panel provided at the substrate shape member, the pressure sensor panel including a plurality of pressure sensors;
    a central module including a reception unit, the reception unit being configured to receive data from the pressure sensor panel; and
    a battery configured to provide power to the pressure sensor panel and the central module;
    wherein the pressure sensor panel comprises:
    a front pressure sensor panel provided at a front of the substrate shape member; and
    a back pressure sensor panel provided at a back of the substrate shape member.

2. The substrate type sensor of claim 1,
wherein the substrate shape member has a substantially same physical size as a substrate.

3. The substrate type sensor of claim 1 further comprising:
a transmission unit configured to transmit the data received from the reception unit to the outside.

4. The substrate type sensor of claim 3,
wherein the transmission unit comprises a wireless communication module.

5. The substrate type sensor of claim 1,
wherein the central module and the battery are provided at the front of the substrate shape member.

6. The substrate type sensor of claim 1,
wherein the substrate type sensor is provided at an apparatus for treating a substrate with a chemical liquid, and
wherein the pressure sensor panel is installed near a location at which the liquid chemical is discharged or at an entirety of the substrate shape member.

7. The substrate type sensor of claim 1,
wherein the substrate type sensor is provided at a liquid treating apparatus for treating a substrate with a chemical liquid, and
wherein the pressure sensor panel is configured to measure one or more of an impact point and an impact force of the liquid chemical.

8. A treating apparatus for treating a substrate with a chemical liquid comprises:
a support unit for supporting the substrate;
a nozzle for discharging a first liquid chemical to a top surface of the substrate disposed on the support unit;
a back nozzle for discharging a second liquid chemical to a bottom surface of the substrate disposed on the support unit; and
a substrate type sensor placed at a location where the substrate is to be placed and comprising:
a substrate shape member;
a pressure sensor panel provided at the substrate shape member, the pressure sensor panel including a plurality of pressure sensors;
a central module including a reception unit, the reception unit being configured to receive data from the pressure sensor panel; and
a battery configured to provide power to the pressure sensor panel and the central module,
wherein the pressure sensor panel comprises:
a front pressure sensor panel provided at a front of the substrate shape member, and
a back pressure sensor panel provided at a back of the substrate shape member,
wherein the front pressure sensor panel is configured to measure one or more of an impact point and an impact force of the first liquid chemical of the nozzle, and
wherein the back pressure sensor panel is configured to measure one or more of an impact point and an impact force of the second liquid chemical of the back nozzle.

9. A substrate type sensor comprising:
a substrate shape member having a substantially same physical size as a substrate;
a front pressure sensor panel provided at a front of the substrate shape member, the front pressure sensor panel including a plurality of pressure sensors;
a back pressure sensor panel provided at a back of the substrate shape member, the back pressure sensor panel including a plurality of pressure sensors;
a central module provided at the front of the substrate shape member, and including a reception unit configured to receive data from the front and back pressure sensor panels and a transmission unit configured to transmit the data received from the reception unit to the outside; and
a battery provided at the front of the substrate shape member and configured to provide a power to the front and back pressure sensor panels and the central module.

* * * * *